(12) United States Patent
Martin et al.

(10) Patent No.: US 10,404,192 B2
(45) Date of Patent: Sep. 3, 2019

(54) PIEZOELECTRIC DEVICE FOR GENERATING ELECTRICAL VOLTAGE

(71) Applicant: ARVENI, Bron (FR)

(72) Inventors: Jean-Frédéric Martin, Chassieu (FR); Sébastien Didier, Cremieu (FR)

(73) Assignee: HAGER ELECTRO SAS, Obernai (FR)

( * ) Notice: Subject to any disclaimer, the term of this patent is extended or adjusted under 35 U.S.C. 154(b) by 413 days.

(21) Appl. No.: 15/125,721

(22) PCT Filed: Mar. 11, 2015

(86) PCT No.: PCT/FR2015/050610
§ 371 (c)(1),
(2) Date: Dec. 12, 2016

(87) PCT Pub. No.: WO2015/136224
PCT Pub. Date: Sep. 17, 2015

(65) Prior Publication Data
US 2017/0179852 A1 Jun. 22, 2017

(30) Foreign Application Priority Data
Mar. 13, 2014 (FR) .................................. 14 52071

(51) Int. Cl.
*H02N 2/18* (2006.01)
*H01L 41/113* (2006.01)

(52) U.S. Cl.
CPC ......... *H02N 2/186* (2013.01); *H01L 41/1136* (2013.01); *B60G 2204/11* (2013.01); *H01L 41/113* (2013.01); *H02N 2/18* (2013.01)

(58) Field of Classification Search
CPC .............................. H02N 2/118; H01L 41/113
See application file for complete search history.

(56) References Cited

U.S. PATENT DOCUMENTS 4,780,062 A * 10/1988 Yamada ................. F04D 33/00
310/316.01
5,353,621 A * 10/1994 Knecht ................. H01L 41/053
29/25.35

(Continued)

FOREIGN PATENT DOCUMENTS

DE 102006025963 12/2007
WO 2010007309 1/2010

OTHER PUBLICATIONS

International Search Report and Written Opinion conducted in corresponding application PCT/FR2015/050610, dated May 11, 2015.

*Primary Examiner* — J. San Martin
(74) *Attorney, Agent, or Firm* — Meunier Carlin & Curfman LLC

(57) ABSTRACT

An electrical voltage-generating piezoelectric device comprising at least a first blade (1) with a curved portion (10) defining a first arm (11) and a second arm (12) of the blade, the first arm (11) being intended to be fastened to a fixed support, the second arm (12) being substantially flat and having a free end (120) designed to oscillate around its resting position under the effect of mechanical force, at least one piezoelectric element (31) resting upon one of the main surfaces (14) of the second arm (12) of the first blade. The device also includes a second blade (2) identical in structure to the first blade (1), the first arms (11, 21) of the first and second blades (1, 2) being fastened together on all or part of their surfaces and being fixed relative to each other.

10 Claims, 7 Drawing Sheets

(56) References Cited

U.S. PATENT DOCUMENTS

| | | | | |
|---|---|---|---|---|
| 5,828,157 | A * | 10/1998 | Miki | H01L 41/094 310/328 |
| 6,534,899 | B1 * | 3/2003 | Takeuchi | H01L 41/094 310/323.17 |
| 6,759,790 | B1 * | 7/2004 | Bugel | F16C 11/12 310/328 |
| 6,876,134 | B2 * | 4/2005 | Ikeda | H01L 41/094 310/330 |
| 8,247,954 | B2 * | 8/2012 | Kagayama | B06B 1/0603 310/324 |
| 8,513,858 | B2 * | 8/2013 | Kagayama | B06B 1/0603 310/328 |
| 8,669,689 | B2 * | 3/2014 | Moler | H02N 2/043 310/328 |
| 8,669,691 | B2 * | 3/2014 | Moler | B81B 3/0021 310/328 |
| 8,850,892 | B2 * | 10/2014 | Moler | H02N 2/043 73/514.34 |
| 2005/0146248 | A1 * | 7/2005 | Moler | H02N 2/043 310/346 |
| 2009/0243254 | A1 | 10/2009 | Chiang et al. | |
| 2011/0109202 | A1 * | 5/2011 | Martin | H02N 2/186 310/339 |

* cited by examiner

PIEZOELECTRIC DEVICE FOR GENERATING ELECTRICAL VOLTAGE

TECHNICAL SCOPE

The invention relates to the field of electricity-generating devices that use the conversion of mechanical or electrical energy through piezoelectric elements. The invention relates more particularly to a new mechanical architecture of such a device, which provides in particular major advantages in terms of implementation, reliability, and performance.

PRIOR TECHNIQUES

Many electrical systems carry their own electrical energy generator. Some of these generators are designed to generate electrical energy, based in particular upon the conversion of energy that is available in proximity to the apparatus. This may well include photovoltaic devices that convert light energy, or devices based upon piezoelectric elements that convert mechanical energy to an electrical voltage resulting from the deformation of said piezoelectric element.

Many devices that generate electrical energy by means of the piezoelectric effect have already been suggested. Such devices generally include a flat vibrating blade, fixed by one of its ends to a fixed support and whose other free end can move under the effect of a mechanical force applied to it. In addition, one or more piezoelectric elements are generally arranged on the surfaces of the blade, and are therefore simultaneously subjected to deformations as the latter oscillates. These deformations cause the occurrence of an electrical voltage at the terminals of the piezoelectric element. This voltage can then be rectified in order to charge a capacitor-type capacitive component, so as to supply a load. Such devices are described, for example, in US 2005/0280561, EP 0 725 452, DE 296 14 851 U, or even U.S. Pat. No. 7,005,778.

A device of this type is also suggested by the Applicant in document WO2010/007309. This piezoelectric device consists in particular of a bent blade with a U or V profile, attached to a fixed support at the curved portion of the blade by means of projections or lateral slots. Both ends of the blade are thus free to oscillate. Depending, however, upon the conditions under which the device is implemented, it is possible that the mechanical strength of the components involved in attaching the blade to the fixed support will degrade over time. The lateral projections are particularly sensitive to aging and to applied mechanical stress, and their retention by means of the lateral slots cannot be ensured in case of impact. Furthermore, an increase in the clamping surface at the curved portion of the blade would imply an increase in damping and thus poor transfer of energy between the two blade arms. In addition, the attachment of piezoelectric elements to the main inner surfaces of the pre-bent blade is complicated.

In another variation shown in document WO2008/099122 of the Applicant, the piezoelectric device also consists of a folded blade with a U or V profile, with one free end that is designed to oscillate under the effect of a mechanical force, and one end that is attached to a fixed support by means of a mechanical element. This configuration in particular allows the bending area to assume the role of a spring by distorting in a special way in order to limit the mechanical stresses at the point where the blade attaches to the fixed support. This configuration is particularly suitable when the excitation of the blade is ensured by the vibration of the support, but inadequate in the case of excitation induced by the application of impulsive force to the free end of the blade. Indeed, in the latter case, a large part of the mechanical energy generated during the excitation of the blade is transmitted to the support and therefore lost.

DESCRIPTION OF THE INVENTION

In this context, the aim of this invention is thus to provide an oscillating blade piezoelectric generator that is free of the limitations mentioned above. This invention aims to provide an efficient piezoelectric generator, that is less bulky and easy to position, with effective and durable mechanical retention over time.

The invention therefore relates to an electrical voltage-generating piezoelectric device comprising at least a first blade with a curved portion defining a first arm and a second arm of the first blade, the second arm being substantially flat and having a free end that is designed to oscillate around its resting position under the effect of a mechanical force, with at least one piezoelectric element resting upon one of the main surfaces of the second arm of the first blade.

According to the invention, the piezoelectric device further comprises a second blade with an identical structure to the first blade, with the first arms of the first and second blades secured to each other and fixed relative to each other.

In other words, the invention device is formed from two curved blades of a similar shape, thus simplifying the manufacturing of the device. Each originally flat and straight blade is bent in order to form a curved portion containing a transversal bending area. Thus, each of the blades has a curved portion defining a first arm and a second arm of the blade, the first arm intended to be secured to a fixed support, and the second arm with a free end that is able to oscillate around its resting position under the effect of a mechanical force applied to it.

In addition, the two blades are joined together such that the first arms remain stationary, even when the free ends of the second arms are oscillating. In particular, the first arms of the first and second blades are preferably secured to one another on all or part of their surfaces and are fixed relative to each other. Various means of fastening the first arms together can be considered. In practice, this attachment may be such that, when the free ends oscillate, the first arms can be compressed or spread out, but the stresses present within the first arms, which are perpendicular to the main surfaces of these first arms, cancel each other out in order to ensure the interlocking of the first arms.

It is understood that the absence of movement of the first arms during the excitation of the blades limits the transfer, and therefore the loss, of mechanical energy to the blade support. For each of the blades, all of the kinetic energy generated during oscillation is therefore temporarily stored within the curved portion.

This result cannot be obtained by the solution offered in the WO2008/099122 application. Indeed, the structure of the prior art solution has been adapted in order to transmit a maximum amount of energy from the support to the blade. It is thus understood that if the blade of this prior art were to be used in pulse mode, a large amount of energy would be transferred to the support and therefore lost.

It is further understood that the fastening of the first arms with the aim of prohibiting any significant mechanical displacement of the first arms, not only limits any loss of energy from the blades to the support, but also reduces the size of the device as it is housed within a case.

The solution of the invention addresses a unique issue, namely a reduction in size combined with improved energy efficiency.

Generally, the more the curvature radius of the curved portion is reduced and closed, the more the curved portion restores energy, thus helping to reduce the damping of the blade. For example, the angle (α) between the second arms can be less than or equal to 30° in the absence of oscillation.

In practice, the two blades are preferably arranged symmetrically relative to a plane that is substantially parallel to the main surfaces of the first arm of one of the blades.

According to one embodiment, each of the first and second blades has a main inner surface and a main outer surface that is opposite to said main inner surface, the main inner surfaces of the first arms of the first blade and the second blade being opposite each other and joined together on all or part of their surfaces.

In other words, in this variation, one of the main surfaces of the first blade is opposite one of the main surfaces of the second blade, and the portions of the main surfaces which are opposite and are defined by the first arms are fastened together on all or part of their surfaces. Both blades thus form a structure with a Y profile.

According to another embodiment, each of the first and second blades has a main inner surface and a main outer surface opposite to said main inner surface. In addition, for each of the first and second blades, the portion of the inner surface defined by the first arm is opposite the portion of the inner surface defined by the second arm. Moreover, the portions of the outer surfaces defined by the first arms are fastened together on all or part of their surfaces. In other words, with this other variation, the two blades form a structure with an E profile.

The size of the device is thus reduced in that the device is housed within the space between the second arms of the blades. In practice, for each blade, in order to avoid any risk of contact of the free ends of the second portions with the first arms when oscillating, the first arm preferably has smaller longitudinal and/or transversal dimensions than those of the second arm.

In a variation of these embodiments, the first arms may be substantially flat, and can be fastened to one another on their entire surface. For example, the first two first arms can be in direct contact, but it is also possible to provide a very thin intermediate part sandwiched between the first two arms.

This intermediate part may, for example, be an additional part with one part interposed between the first arms and a second part intended to be fastened to the fixed support. The thickness of this additional part is preferably less than a few millimeters. This particular configuration allows a degree of freedom to be added with regards to the positioning of the blades in relation to the fixed support.

In practice, the fastening of the first arms to one another can be achieved by various suitable means such as gluing, welding, fastening by clamping or by screwing, etc . . .

For example, the first arms may have one or more recesses. Each of these recesses is particularly suitable for cooperating with fastening means designed to attach the first arms to each other and/or to fasten the first arms to the fixed support. The first arms may thus have openings or notches intended to be used with screws.

It is advantageous that the first part of each of the blades extends from the curved portion with transversal narrowing. This transversal narrowing may be partial, meaning over a portion of the length of the arm, or meaning over the entire length of the arm. In other words, regardless of the recesses defined above, the end of the first arm which is attached to the curved portion has a notch, so that the transversal dimension, i.e., the width, of the first arm is generally less than or equal to that of the second arm. In particular, this solution allows the piezoelectric device to be attached to a fixed support without increasing the overall transversal dimension of the piezoelectric device. For example, the piezoelectric device may be attached to the fixed support by means of an outer part or an indentation made in the support with an inverse geometry to that of the notch.

The transversal dimension of the first arm may be greater, over all or part of its length, than that of the second arm, which is advantageous. In this case, it is preferable for the longitudinal dimension of the first arm to be less than or equal to that of the second arm. In other words, the first arm may be provided with projections which extend transversely. These projections may have with recesses as described above.

This arrangement makes it possible, in particular, to have a larger first arm that is not subject to deformation during the oscillation of the second arm. It is therefore possible to have a larger contact surface for positioning and holding the blades upon a fixed support, and to use a less bulky means of attaching the blade to the fixed support. With this arrangement, the piezoelectric device is more compact, and the risk of inappropriate contact between the blades during extreme oscillation is minimized. In addition, the housing of the device is made easier and the retention is more reliable.

Thus, in general, for each of the first and second blades, the transversal dimension of the first arm can be different from that of the second arm.

According to another variation of these embodiments, it is possible to implement the interweaving of the first arms such that they mutually assure their blockage when the blades oscillate. More specifically, the first arms may be shaped in order to allow for the interweaving of all or part of the first arms.

In practice, the interweaving may be such that the first arms are in contact with each other within three areas, namely:
one area close to the curved portion;
one area located at the intersection of the first arms;
one area close to the free end of the first arms.

For example, in one variation, each first arm may be provided with at least one slot through which a portion of the other arm passes. In particular, each of the first arms can be formed from a central portion connecting a proximal and a distal portion, the central portion having transversal dimensions that are less than those of the distal and proximal portions. In this variation, the interweaving may be such that the outer surfaces defined by the proximal portions are opposite each other and the inner surfaces of distal portions are opposite each other.

It is advantageous that each of the second arms has at least one projection which can extend laterally and/or longitudinally from its free end, with said projection being designed to cooperate with an outer mechanism intended for the application of mechanical stress to said free end. The outer mechanism is particularly shaped in order to ensure the application of an impulsive force to the free end of the blades, that is to say the application of a predetermined force and amplitude and the instant release of the blades. In practice, the projections may be obtained by the machining of the blade or by adding a suitable part to the end of the blade.

Furthermore, each of the blades may include one or more piezoelectric elements arranged on one of the main surfaces or on both main surfaces of the second arm. In other words, for each blade, piezoelectric elements may be arranged on the inside and/or outside of the second arm.

In practice, the piezoelectric elements are preferably arranged near the curved portion.

For example, the piezoelectric element can be arranged within a region extending from the curved portion to a point located at a distance of between 20 and 70% of the length of the second arm.

This proposed arrangement allows for a piezoelectric device that has an elevated mechanical quality factor, as well as greater mechanical coupling compared to prior art solutions. Moreover, the transfer of energy to the bearing port is minimized, and the fastening solutions are more robust and reliable over time. In addition, the embodiment of these blades does not require a complex manufacturing process.

BRIEF DESCRIPTION OF THE DRAWINGS

Further characteristics and advantages of the invention will become apparent from the description provided below, which is for reference only and is in no way restrictive, with reference to the accompanying figures, in which.

A DETAILED DESCRIPTION OF SOME SPECIFIC EMBODIMENTS

Different variations of the invention's mechanical device are presented below. The mechanical devices described below include both blades of a substantially identical shape made from rigid material.

Each blade is originally flat and straight, and therefore has a main inner surface and a main outer surface opposite the main inner surface. The blade is folded such that it has a curved portion containing a transversal bending area. This curved portion thus defines the first and second arms of the blade. The first arm is intended to be fastened to a fixed support and the second arm has a free end that is designed to oscillate. Furthermore, one or more piezoelectric elements may be arranged on the main surfaces of the second arm. The two blades are precisely arranged in relation to each other, for example symmetrically in relation to the plane containing one of the main surfaces of the first arm of one of the blades. In addition, these two blades are fastened together at their first arm, the second arms preferably forming an angle of less than or equal to 30° in the absence of oscillation.

Figure 1:
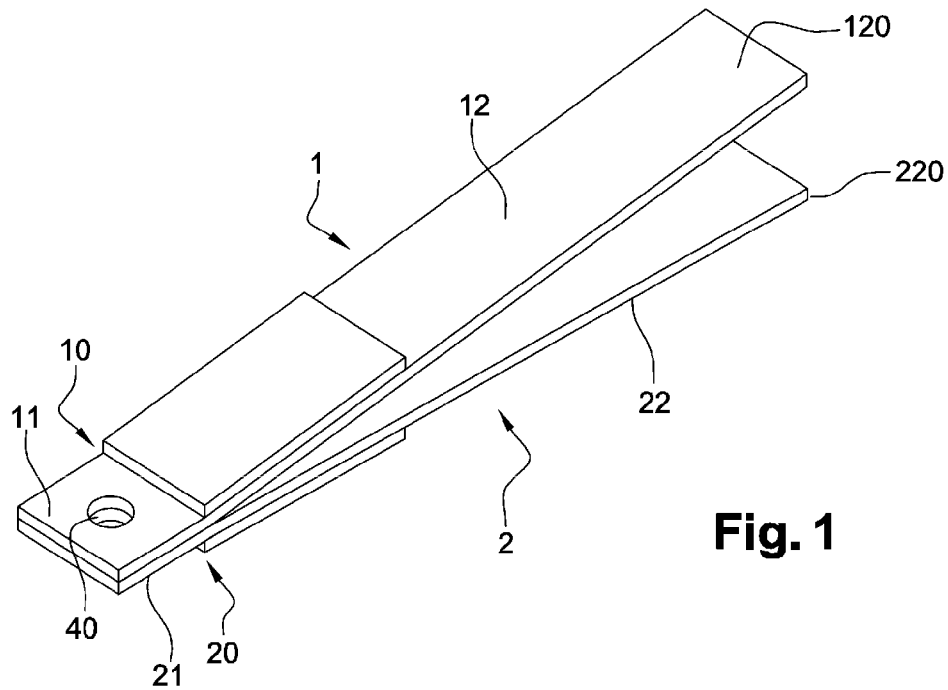
FIG. 1 is a schematic diagram of the device according to one embodiment of the invention.
Figure 2:
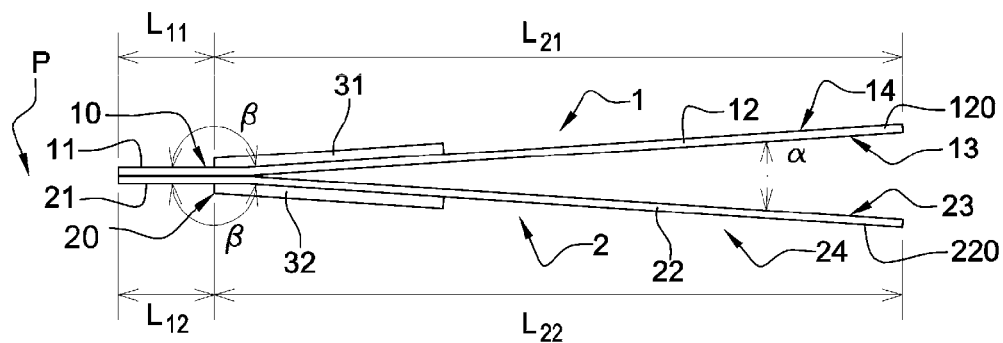
FIG. 2 is a profile view of the device from FIG. 1.

In the embodiment illustrated in FIGS. 1 and 2, we therefore see the two curved blades 1, 2, each with two opposing main surfaces, namely the main inner surface 13, 23 and the main outer surface 14, 24. Each of the curved blades 1, 2 is therefore formed from the curved portion 10, 20 containing the transversal bending area connecting the first fixed arm 11, 21 and the second arm 12, 22 with the free end 120, 220. In this embodiment, for each of the blades 1, 2, the curvature radius of the curved portion is preferably at least equal to the thickness of the blade, for example equal to 0.8 mm. In other words, the obtuse β angle formed between the first arm 11, 21 and the second arm 12, 22 is preferably between 160° and 179°, e.g. 176°. Furthermore, the first and second arms are substantially straight and flat. The ratio between the length L11, L12 of the first arm 11, 21 and the length L21, L22 of the second arm 12, 22 is preferably between 10 and 120%, e.g. 25%.

Of course, the shape and dimensions of the first arm adapt according to installation requirements and size of the device.

Each of the blades carries a piezoelectric element 31, 32 upon their main outer surface 14, 24.

The two blades are precisely arranged in relation to each other, and the two blades 1, 2 are fastened to each other at the first arms 11, 21, thereby forming a structure with a Y profile. The two blades are arranged symmetrically with respect to a P plane parallel to the first arms, and the main inner surfaces 13, 23 of the two blades 1, 2 are positioned opposite one another.

In this embodiment, the first arms 11, 21 are fixed to each other, for example by gluing or welding the first arms 11, 21 to each other. As illustrated in FIG. 1, it is also possible to provide a hole 40 that goes through the first arms 11, 21, which can be used with a screw or any other suitable means to ensure that the first arms 11, 21 are fastened together. Moreover, this screw can also be used to ensure the attachment of the blades 1, 2 to the fixed support (not shown).

It is therefore understood that the application of force, particularly to the free end of each of the blades, allows their oscillation and thus the generation of electrical energy by the piezoelectric element.

This arrangement provides a compact and robust structure comprising two blades that are designed to oscillate. This arrangement has several advantages, such as a simpler process for bonding the piezoelectric elements onto the blades, and an easier manufacturing process for the device in that it is sufficient to manufacture two identical blades and then assemble them.

In another embodiment illustrated in FIGS. 3 through 11, the structure is now in the form of an E. Here we find again the two curved blades 1, 2, that each have two opposing main surfaces, namely the main inner surface 13, 23 and the main outer surface 14, 24. Each of the curved blades 1, 2 is therefore formed from the curved portion 10, 20 containing the transversal bending area connecting the first fixed arm 11, 21 and the second arm 12, 22 with the free end 120, 220. The curvature radius of the curved portion 10, 20 should preferably be at least equal to the thickness of the blade, for example equal to 0.6 mm. In other words, the acute angle γ formed between the first arm 11, 21 and the second arm 12, 22 is preferably between −5 and 20°, for example equal to 6°. Thus, in this embodiment, the curvature radius of the curved portion 10, 20 is such that the main inner surface 13, 23 of the first arm 11, 21 is opposite the main inner surface 13, 23 of the second arm 12, 22.

The first and second arms are also substantially straight and flat, and the piezoelectric elements 31, 32 are arranged upon the main outer surfaces 14, 24 of the blades at the second arms.

The two blades 1, 2 are precisely arranged in relation to each other, and are in particular arranged symmetrically with respect to a P plane parallel to the first portions 11, 21.

The two blades 1, 2 are fastened to each other at the first arms 11, 21, thereby forming a structure with an E profile. The first arms 11, 21 are fixed in relation to each other by any suitable means, for example by gluing or welding the first arms 11, 21 together.

Figure 3:
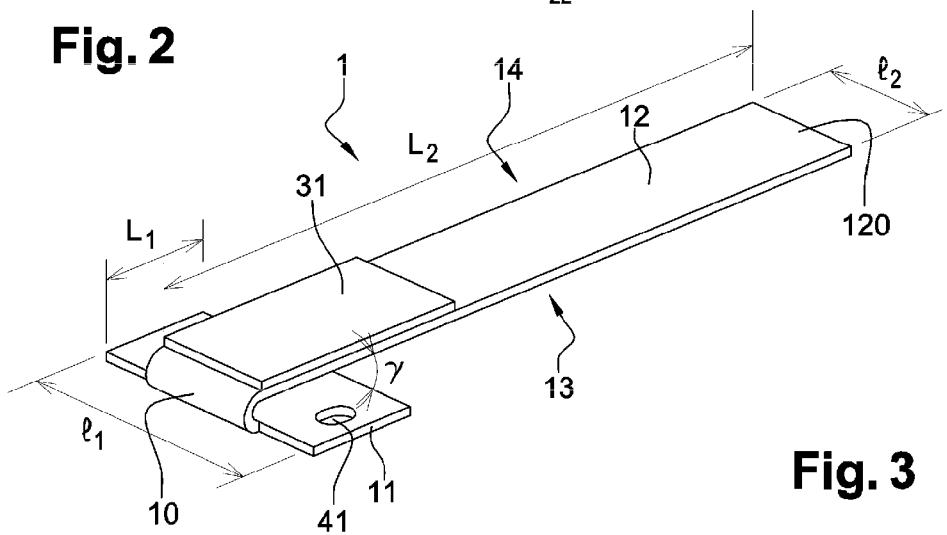
FIG. 3 is a schematic diagram of one of the device's blades according to another embodiment.
Figure 4:
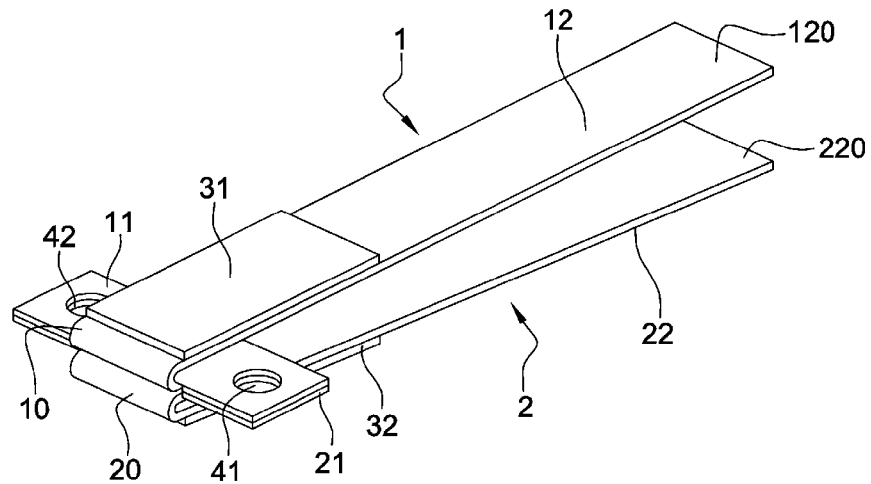
FIG. 4 is a schematic diagram of the device incorporating two blades from FIG. 3.
Figure 5:
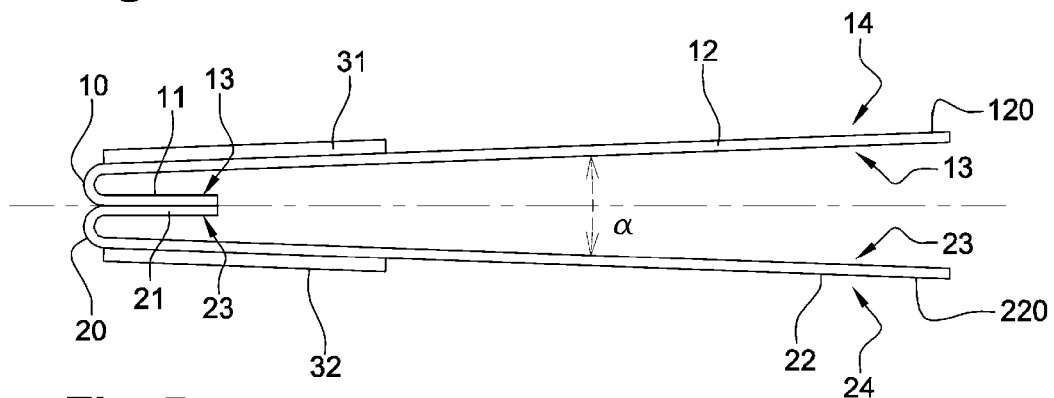
FIG. 5 is a profile view of the device from FIG. 4.

In the variation illustrated in FIGS. 3 and 5, the first and second arms of each blade have different dimensions. In particular, for each blade, the second arm 12, 22 preferably extends longitudinally and the first arm 11, 21 preferably extends transversely and perpendicularly to the second arm. For example, as shown in FIG. 3, the longitudinal dimensions of the first and second arms may be such that L1 is between 10 and 120% of L2. The transversal dimensions of the first and second arms 11 and 12 are adapted depending on the required space.

In this variation, the fastening of the first arms in relation to each other can be ensured by openings 41, 42 that pass through the first portions 11, 21 and work with screws. Moreover, the openings and screws may also serve to ensure the attachment of the blades 1, 2 to the fixed support (not shown).

Figure 6:
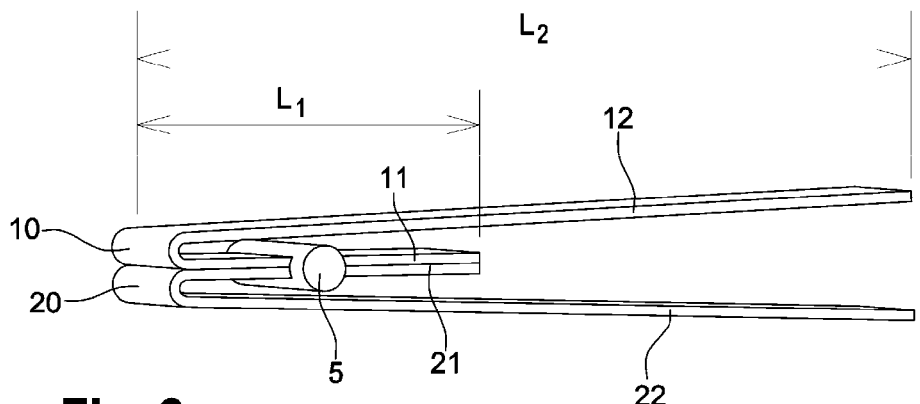
FIGS. 6 to 9 are schematic diagrams of the device according to different variations of the invention concerning how to fasten the blade to the support.

In another variation illustrated in FIG. 6, for each blade, the first and second arms 11, 21, 12, 22 preferably extend longitudinally with the particularity that the first arm is shorter than the second arm. In addition, as shown in FIG. 6, the first arms of the blades may be held together by means of at least one insert 5 in the form of a clip, cotter pin, walls attached to the support, etc.

Figure 7:
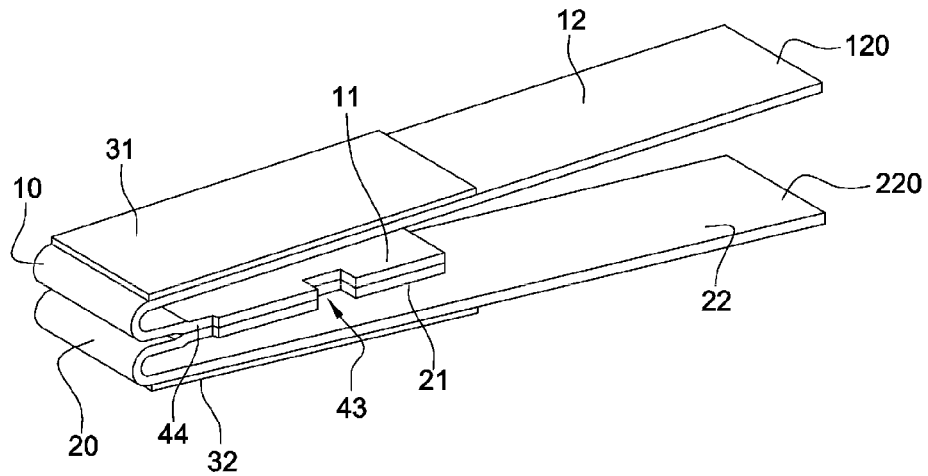

In another variation shown in FIG. 7, it is possible to provide lateral recesses 43 implemented within the first arms. These lateral recesses 43 may cooperate in particular with other mechanical parts in order to keep the first arms immobile and to fasten the blades to the fixed support. In addition, the first arm of each of the blades may extend from the curved portion with transversal narrowing. Thus, the end of the first arm which is attached to the curved portion has a notch 44, such that the transversal dimension of the first arm is generally less than or equal to that of the second arm.

Figure 8:
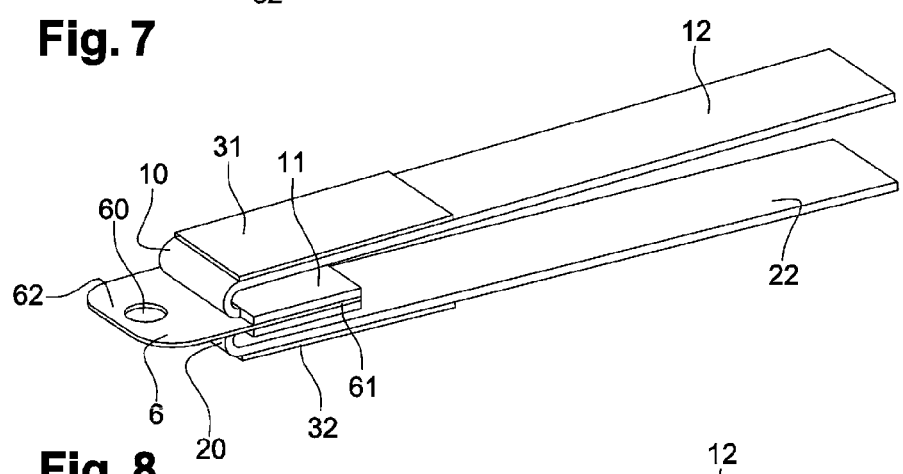
Figure 9:
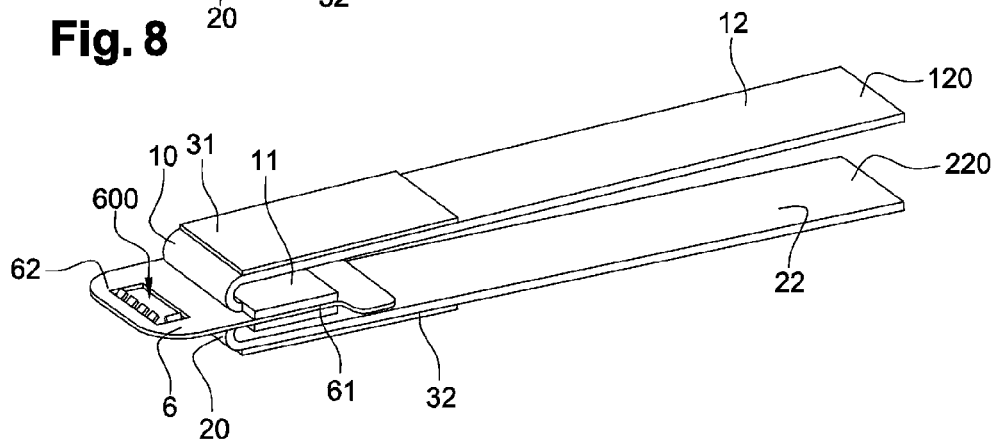

According to another variation illustrated in FIGS. 8 and 9, the first arms can be fastened to the fixed support by means of an insert 6, for example in the form of a tab sandwiched between the first portions 11, 21. This insert 6 is preferably made of a metallic material and has a first part 61 that is in direct contact with the first arms 11, 21 of the blades 1, 2 and a second part 62 that is intended to be fastened to the fixed support. The first part may in particular be attached to the first arms by means of bonding, welding, riveting or any suitable means. The second part 62 can in particular be provided with a through hole 60 which is designed to cooperate with a screw for fastening to the support (FIG. 8) or it can be provided with an opening 600 (FIG. 9) whose edges present a relief for the attachment of the insert 6 to the support.

Figure 10:
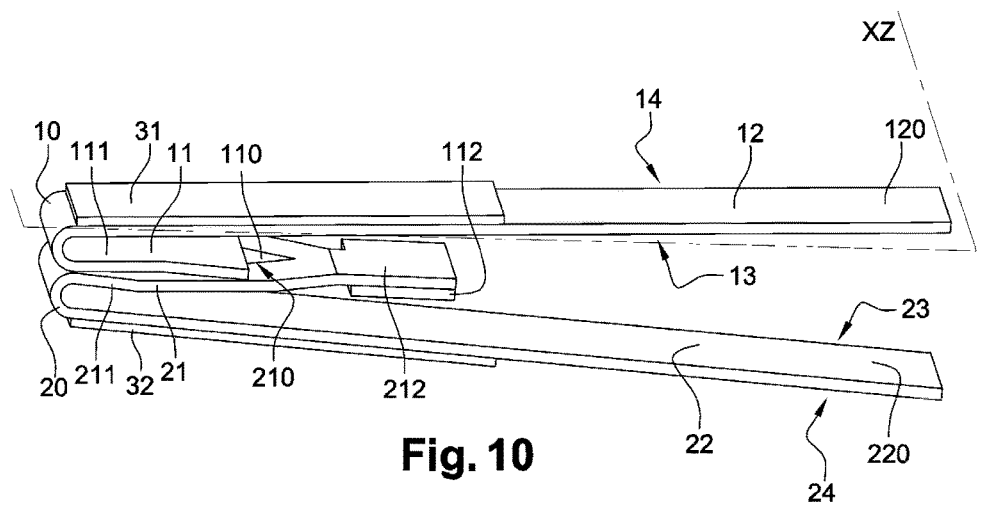
FIG. 10 is a schematic diagram of the device according to another variation of the invention concerning the retention of the blades in relation to each other.
Figure 11:
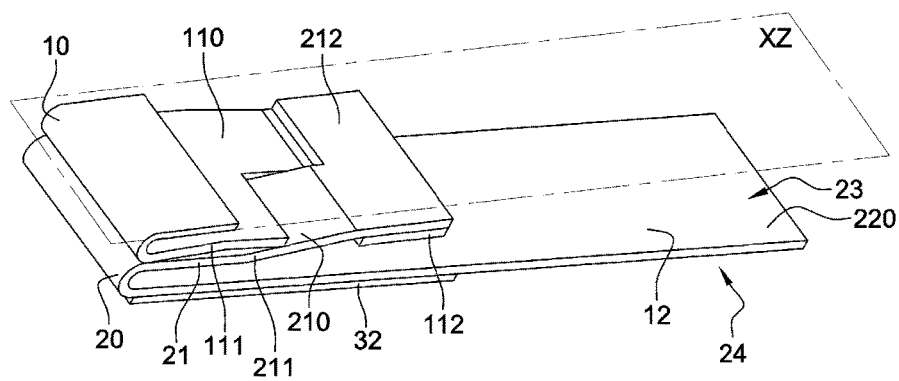
FIG. 11 is a sectional view of the XZ plane of the device from FIG. 10.

According to another variation illustrated in FIGS. 10 and 11, the first arms are fixed together by interweaving the first arms. More specifically, a wide slot, or recess, is formed in each of the first arms such that each of the first arms has a longitudinally central portion 110, 210 connecting a proximal portion 111, 211 to a distal portion 112, 212. The interweaving is achieved by bringing together the central narrowed sections 110, 210 at the slots, such that the outer surfaces 14, 24 of the proximal portions 111, 211 are opposite one another, and the inner surfaces 13, 23 of the distal portions 112, 212 lie on top of one another. A third contact between the first arms results from the merging of the central sections, this third contact being located near the curved portions 10, 20.

Figure 12:
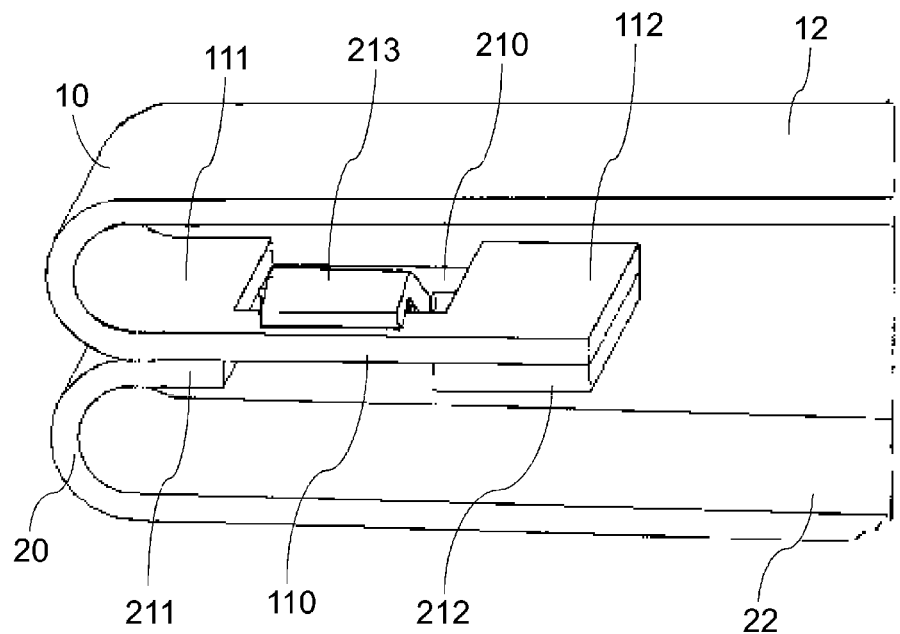
FIGS. 12 and 13 are schematic diagrams of the device according to another variation of the invention concerning the retention of the blades in relation to each other.
Figure 13:
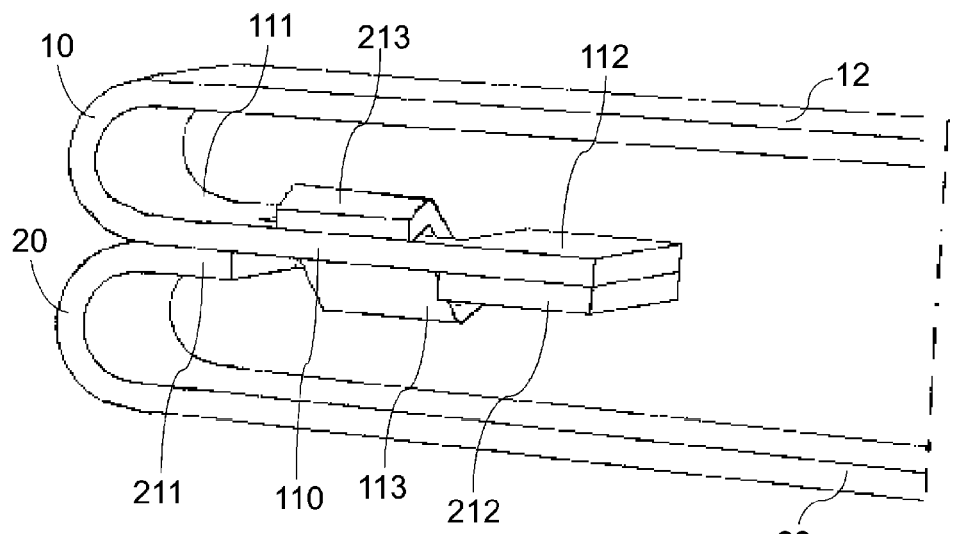

According to another variation illustrated in FIGS. 12 and 13, the interlocking of the first arms is obtained by interweaving the central sections 113, 213 of the first arms. In this case, each of the central sections 113, 213 can be defined by two notches, and preferably has transversal dimensions that are substantially identical to those of the proximal portion 111, 211 and distal portion 112, 212. In this variation, the interweaving can be obtained by bringing together the opposite outer surfaces defined by the proximal and distal portions, and by bringing together the inner surfaces defined by the central portions.

In practice, the dimensioning and positioning of the various components can be optimized in order to ensure maximum efficiency. The length and width of the second arm can be used to define an operating force and an amount of energy that can be recovered by the generator.

Furthermore, the positioning of the piezoelectric element upon the blade also plays a role in the level of performance that can be achieved. It was thus observed that it is advantageous for the piezoelectric element to be located within a region located as near as possible to the curved portion. This region, when optimally positioned, extends between, firstly, the junction of the second portion with the curved portion, and secondly, a second point that is removed from the first point by a length of between 20 and 60% of the length of the second portion. The length of the piezoelectric element may represent between 20 and 60% of the length of the second portion. Of course, it is possible to have several sequential or parallel piezoelectric elements on the blade.

According to one particular embodiment, the second part of each of the blades may have a particular shape that is adapted to an external mechanism (not shown), that is designed to oscillate the blades by applying impulsive force to the ends of the blades.

Figure 14:
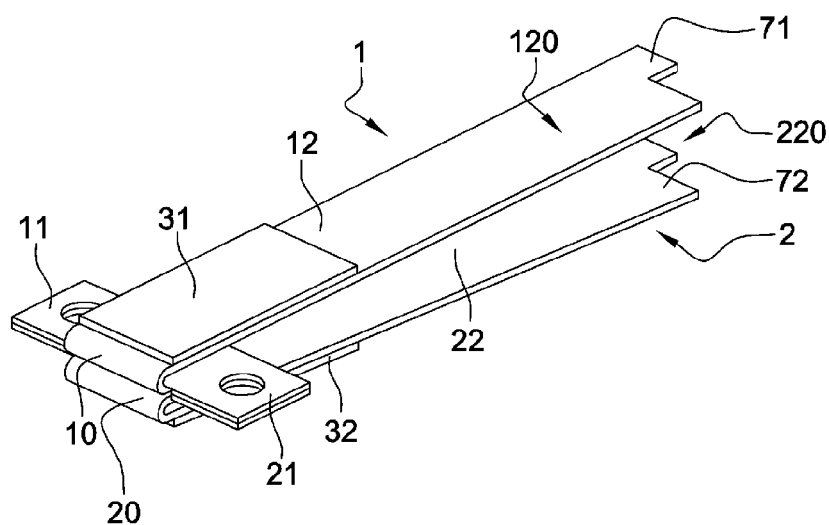
FIGS. 14 to 18 are schematic diagrams of the device according to other variations of the invention in which the free ends of the blades have specific forms.
Figure 15:
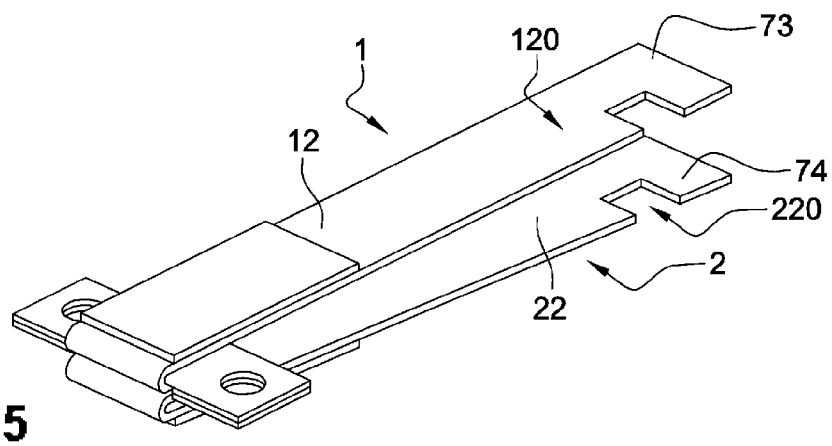
Figure 16:
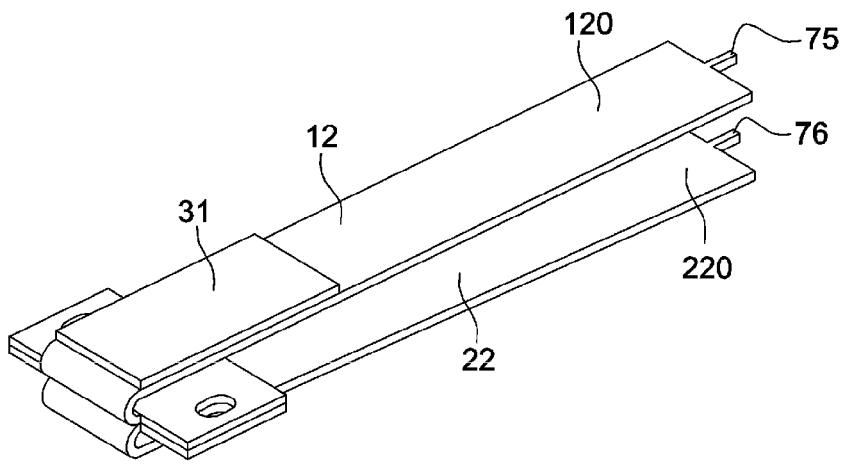
Figure 17:
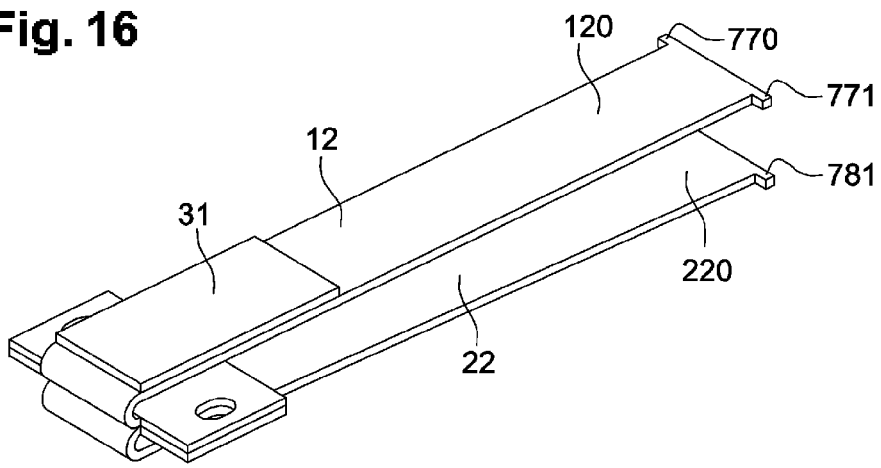
Figure 18:
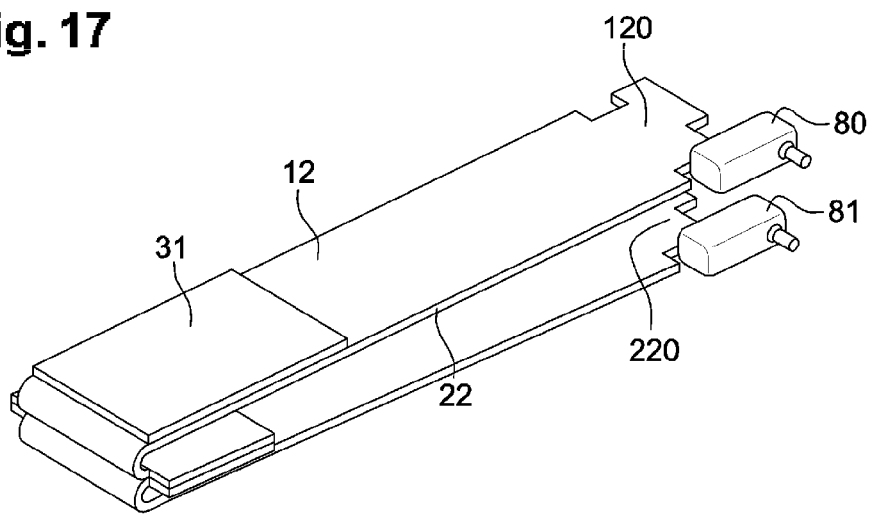

For example, it is possible to provide on each of the second arms 12, 22, one or more projections 71, 72, 73, 74, 75, 76, 770, 771, 780 (FIGS. 14 through 18), which may for example, extend longitudinally (FIGS. 14 through 16) or transversely (FIG. 17) along the free ends 120, 220. Each of the projections is in particular intended to cooperate with an external mechanism for applying a pulse to the corresponding free ends. Of course, each of the projections may also be obtained by means of the provision of another additional part 80, 81 designed to be fixed to the corresponding free end 120, 220 (FIG. 18).

The device presented above can be used extensively as a source of electrical energy as a replacement for accumulators, batteries, for wireless sensor network applications or for any application requiring a dedicated independent power source, with the benefit of an extended life cycle.

These include measurement instrument applications regarding physical parameters in the petrochemical or pharmaceutical-type process industries. Mention may also be made of specific sensor applications for temperature, pressure or flow rate sensors, and particularly within water or gas distribution networks. The device presented is particularly well-suited for use in electrical devices such as switches, wireless doorbells or opening-detection devices. In miniaturized versions, the invention can also be used to supply power to micro-electro-mechanical systems (MEMS).

The invention claimed is:

1. An electrical voltage-generating piezoelectric device comprising at least a first blade (1) with a curved portion (10) defining a first arm (11) and a second arm (12) of the blade, the first arm (11) being intended to be fastened to a fixed support, the second arm (12) being substantially flat and having a free end (120) that is designed to oscillate around its resting position under the effect of a mechanical force, at least one piezoelectric element (31) resting upon one of the main surfaces (14) of the second arm (12) of the first blade,
wherein the electrical voltage-generating piezoelectric device includes a second blade (2) identical in structure to the first blade (1), wherein the first arms (11, 21) of the first and second blades (1, 2) are fastened together on all or part of their surfaces and being fixed relative to each other, and wherein in that each of the first and second blades (1, 2) has a main inner surface (13, 23) and a main outer surface (14, 24) opposite to said inner main surface, and in that for each of the first and second blades (1, 2), the portion of the inner surface (13, 23) defined by the first arm (11, 21) faces the portion of the inner surface (13, 23) defined by the second arm (12, 22), the portions of the outer surfaces defined by the first arms being joined together on all or part of their surfaces.

2. Device according to claim 1, characterized in that each of the first and second blades (1,2) has a main inner surface (13, 23) and a main outer surface (14, 24) that is opposite to said main inner surface, the main inner surfaces of the first arms (11, 21) of the first blade (1) and the second blade (2) being next to each other and being joined together on all or part of their surfaces.

3. Device according to one of claims 1 through 2, characterized in that the first arms (11, 21) are in direct contact.

4. Device according to one of claims 1 through 2, characterized in that the first arms (11, 21) are fastened to the fixed support by means of an insert (6) fastened to the first arms (11, 21) and having a first part (61) interposed between the first arms (11, 21) and a second part (62) intended to be fastened to the fixed support.

5. Device according to one of claims 1 to 2, characterized in that each of the first arms (11, 21) has at least one recess (40, 41, 42, 43) designed to at least cooperate with the means of fastening the first arms (11, 21) to the fixed support.

6. Device according to one of claims 1 through 2, characterized in that for each of the first and second blades (1, 2), the transversal dimension of the first arm (11, 21) is different from that of the second arm (21, 22).

7. Device according to one of claims 1 to 2, characterized in that interlocking of the first arms (11, 21) is assured by interweaving of all or part of the first arms.

8. Device according to claim 7, characterized in that each of the first arms is formed from a central portion ((110, 210) connecting a proximal portion (111, 211) and a distal portion (112, 212), the central portion having transversal dimensions that are smaller than those of the distal and proximal portions, the outer surfaces defined by the proximal portions being opposite one another and the inner surfaces of the distal portions being opposite one another.

9. Device according to claim 7, characterized in that each of the first arms is formed from a central portion ((110, 210) connecting a proximal portion (111, 211) and a distal portion (112, 212), the central portion having transversal dimensions that are substantially identical to those of the distal and proximal portions, the outer surfaces defined by the proximal portions being opposite one another and the inner surfaces of the distal portions being opposite one another.

10. Device according to one of claims 1 through 2, characterized in that each of the second arms has at least one projection (71, 72, 73, 74, 75, 76, 770, 771, 781) designed to cooperate with an external mechanism for applying mechanical stress to the blades.

* * * * *